US008901648B2

(12) United States Patent
Sutardja et al.

(10) Patent No.: US 8,901,648 B2
(45) Date of Patent: Dec. 2, 2014

(54) MOS DEVICE WITH LOW ON-RESISTANCE

(75) Inventors: Sehat Sutardja, Los Altos Hills, CA (US); Ravishanker Krishnamoorthy, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 798 days.

(21) Appl. No.: 12/337,059

(22) Filed: Dec. 17, 2008

(65) Prior Publication Data

US 2009/0250751 A1    Oct. 8, 2009

Related U.S. Application Data

(60) Provisional application No. 61/014,110, filed on Dec. 17, 2007.

(51) Int. Cl.
| | |
|---|---|
| *H01L 29/78* | (2006.01) |
| *H01L 29/423* | (2006.01) |
| *H01L 29/06* | (2006.01) |
| *H01L 29/417* | (2006.01) |

(52) U.S. Cl.
CPC ............ *H01L 29/78* (2013.01); *H01L 29/4238* (2013.01); *H01L 29/0692* (2013.01); *H01L 29/41725* (2013.01); *H01L 29/7816* (2013.01); *H01L 29/0696* (2013.01)
USPC .......................................... 257/335; 438/197

(58) Field of Classification Search
CPC ............ H01L 29/0692; H01L 29/4238; H01L 29/0696; H01L 29/78; H01L 29/7835; H01L 27/088; H01L 29/735; H01L 29/41758; H01L 29/4175

USPC ......... 257/342–345, 401, 408–409, 309, 335, 257/337; 438/197, 284
See application file for complete search history.

(56) References Cited

U.S. PATENT DOCUMENTS

| | | | | | |
|---|---|---|---|---|---|
| 4,001,860 | A | * | 1/1977 | Cauge et al. | 257/336 |
| 5,763,319 | A | * | 6/1998 | Ling et al. | 438/514 |
| 5,852,315 | A | * | 12/1998 | Ker et al. | 257/355 |
| 5,986,292 | A | * | 11/1999 | Mizuno et al. | 257/202 |
| 6,140,687 | A | | 10/2000 | Shimomura et al. | |
| 2007/0034903 | A1 | | 2/2007 | Sutardja | |
| 2008/0135934 | A1 | * | 6/2008 | Liu | 257/343 |

FOREIGN PATENT DOCUMENTS

| | | | |
|---|---|---|---|
| EP | 0 845 815 A | 6/1998 | |
| JP | 05 082782 A | 4/1993 | |

* cited by examiner

*Primary Examiner* — Marcos D. Pizarro
*Assistant Examiner* — Sue Tang (57) ABSTRACT

Some of the embodiments of the present disclosure provide a metal oxide semiconductor (MOS) device comprising a drain region, a gate region surrounding the drain region and formed in a loop around the drain region, a plurality of source regions arranged around the gate region, wherein each source region is situated across from a corresponding side of the drain region, and a plurality of bulk regions arranged around the gate region, wherein one or more of the plurality of source regions separate one or more of the plurality of bulk regions from the gate region. Other embodiments are also described and claimed.

20 Claims, 8 Drawing Sheets

MOS DEVICE WITH LOW ON-RESISTANCE

CROSS REFERENCE TO RELATED APPLICATIONS

The present application claims priority to U.S. Patent Application No. 61/014,110 filed Dec. 17, 2007, entitled "Low Ron SQDMOS," the entire specification of which is hereby incorporated by reference in its entirety for all purposes, except for those sections, if any, that are inconsistent with this specification.

TECHNICAL FIELD

Embodiments of the present invention relate to the field of metal oxide semiconductor (MOS) devices, and more particularly, MOS devices with low on-resistance.

BACKGROUND

Figure 1:
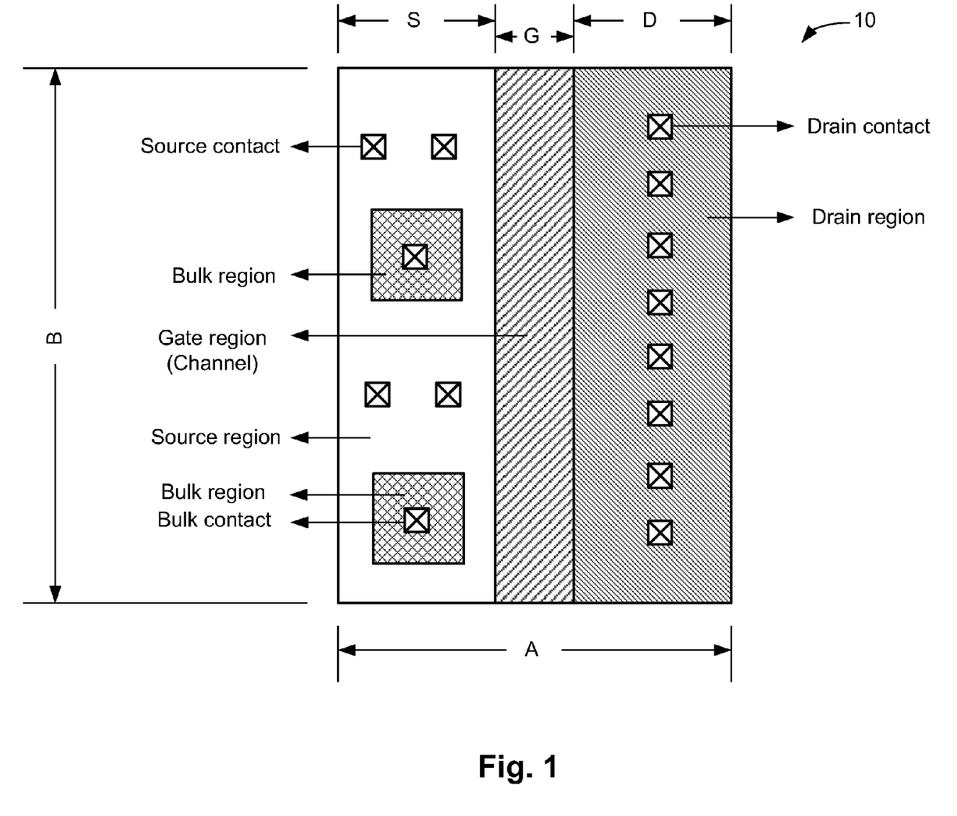
FIG. 1 illustrates a top view of an exemplary conventional MOS structure.

FIG. 1 illustrates a top view of an exemplary conventional metal oxide semiconductor (MOS) cell 10 with gate, drain, source, and bulk (body) regions, each region including respective contacts. The width of the MOS channel (gate region) may be B and the length of the MOS channel may be G, whereas the lengths of the source and drain regions may be S and D, respectively. The length of the MOS cell 10 may be A, which may include the lengths of the source, gate and drain regions. In various embodiments, the dimensions B, S, G and D may be based on design rules of a particular process technology to achieve certain reliability and voltage capabilities, as is well known in the art. The total area of the MOS may be A×B.

The on-resistance (Ron) of the MOS cell 10 may depend at least in part on the dimensions of various regions. For example, a larger width B may result in a smaller Ron, and a smaller length G may result in a smaller Ron. By reducing the Ron, the number of times the MOS switches within a given time period may be increased, and thus, higher switching speeds and lower energy use per switching event may be attained.

However, in order to reduce the Ron, if the width B of the MOS channel is increased, the area of the MOS cell will also increase proportionally. An increased MOS area may result in chips with less computing power in the same area, or larger chips with increased manufacturing costs. Therefore, it may be desired to reduce the Ron without substantially increasing the area of the MOS.

Figure 2:
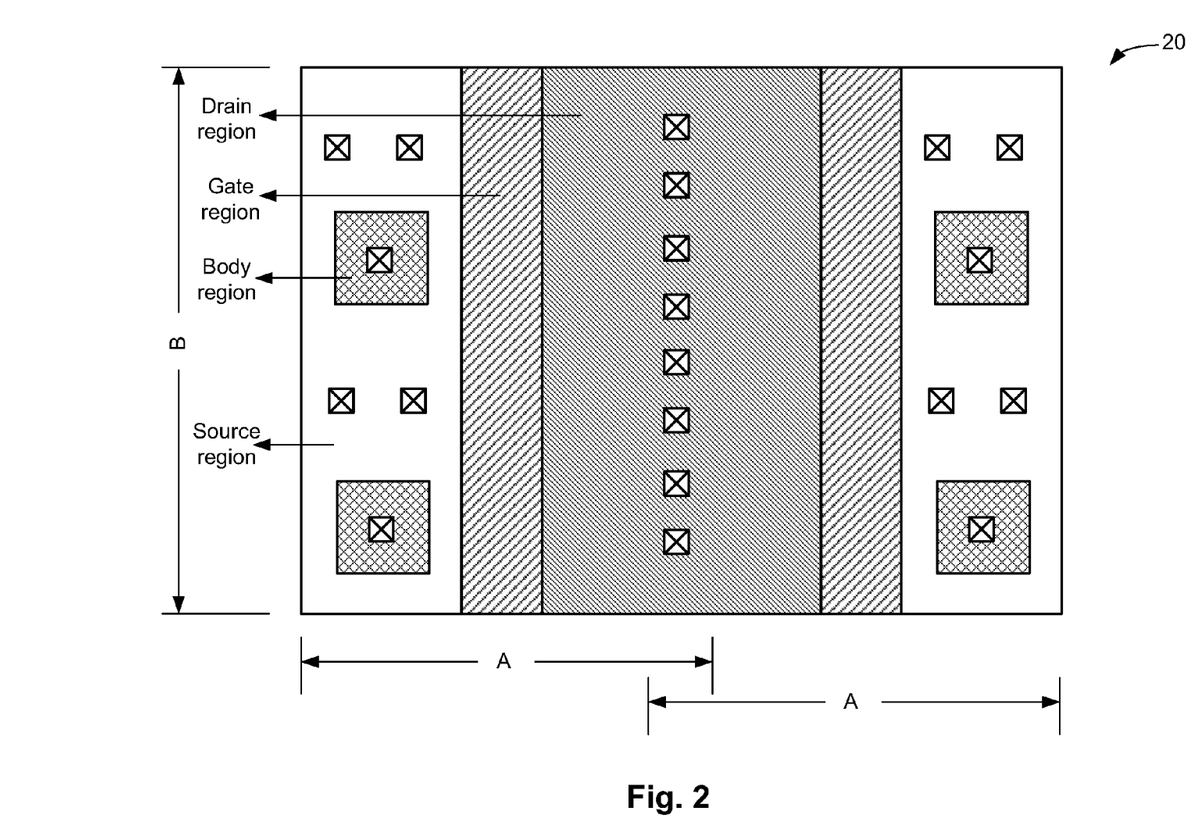
FIGS. 2 and 3 illustrate top views of two exemplary conventional arrays of MOS cells.
Figure 3:
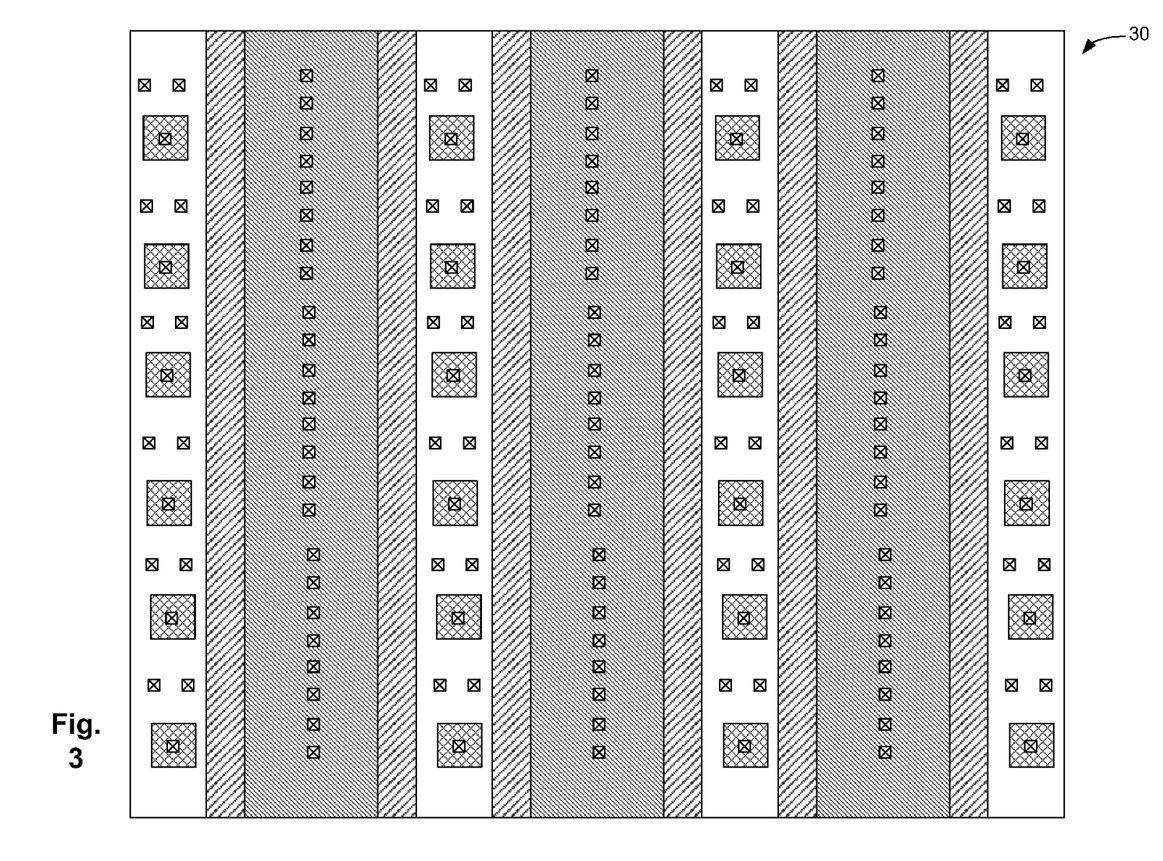

One way to reduce the Ron consists of mirroring two basic MOS cells such that the drain regions of each cell overlap, as illustrated in the exemplary MOS array 20 of two MOS cells in FIG. 2. In the MOS array 20, the effective width B is doubled (as there are two MOS channels, each with a width of B), thereby decreasing the Ron, while the total area of the array 20 is less than double of the area of a single MOS cell (i.e., less than double of A×B). This structure may be repeated, as illustrated in the MOS cell array of FIG. 3, to obtain an even smaller Ron, with mirroring of a large number of basic MOS cells.

However, it may be desirable to further increase the channel width to decrease the Ron, without substantially increasing the area of the MOS cell.

SUMMARY

In various embodiments, the present disclosure provides an apparatus and a method for a MOS device with Ron. More specifically, there is provided, in accordance with various embodiments of the present disclosure, a metal oxide semiconductor (MOS) device comprising a drain region, a gate region surrounding the drain region and formed in a loop around the drain region, a plurality of source regions arranged around the gate region, wherein each source region may be situated across from a corresponding side of the drain region, and a plurality of bulk regions arranged around the gate region, wherein one or more of the plurality of source regions may separate one or more of the plurality of bulk regions from the gate region. In various embodiments, the gate region may be formed in a closed loop around the drain region, and none of the plurality of bulk regions may be adjacent to the gate region. In various embodiments, a first source region may be adjacent to a first bulk region and a second bulk region, a second source region may be adjacent to a third bulk region and a fourth bulk region, a third source region may be adjacent to the third bulk region, and a fourth source region may be adjacent to the fourth bulk region. In various embodiments, the second source region may be adjacent to the third source region and the fourth source region, and the first source region may not be adjacent to any of the second, third and the fourth source regions. The drain region may have a multi-sided polygon shape including one of a square, a rectangle, a hexagon and an octagon. The bulk regions may be arranged in one or more corners of the device. A channel region may be formed beneath the gate region, and may be configured so that current flows from each source region to the drain region. In various embodiments, the device may be a transistor, and may be formed on a substrate. The substrate may be a silicon substrate, and the gate region may include polysilicon. In various embodiments, the device may be a square double-diffused MOS (SQDMOS). Each of the plurality of bulk regions may have at least one bulk contact, each of the plurality of source regions may have at least one source contact, and the drain region may have at least one drain contact.

There is also provided, in accordance with various embodiments of the present invention, a MOS device having a plurality of MOS transistor cells formed in an array on a substrate, each MOS transistor cell comprising a drain region, a gate region surrounding the drain region and formed in a loop around the drain region, a plurality of source regions arranged around the gate region, wherein each source region may be situated across from a corresponding side of the drain region, and a plurality of bulk regions arranged around the gate region, wherein one or more of the plurality of source regions may separate one or more of the plurality of bulk regions from the gate region. At least one of the plurality of source regions of one of the plurality of MOS transistor cells may overlap with a corresponding source region of the plurality of source regions of a bordering MOS transistor cell. A gate region of one of the plurality of MOS transistor cells may be adjacent to a gate region of a bordering MOS transistor cell.

There is also provided, in accordance with various embodiments of the present invention, a method for forming a MOS device, comprising forming a drain region, forming a gate region that surrounds the drain region in a loop, forming a plurality of source regions arranged around the gate region, wherein each source region may be formed across from a corresponding side of the drain region, and forming a plurality of bulk regions arranged around the gate region, wherein one or more of the plurality of source regions separate one or more of the plurality of bulk regions from the gate region. Forming the bulk regions may further comprise forming the plurality of bulk regions such that none of the plurality of bulk regions is adjacent to the gate region. Forming the plurality of source regions may further comprise forming a first source region adjacent to a first bulk region and a second bulk region, forming a second source region adjacent to a third bulk region and a fourth bulk region, forming a third source region adjacent to the third bulk region, and forming a fourth source region adjacent to the fourth bulk region.

In various embodiments, forming the plurality of source regions may further comprise forming the plurality of source regions such that the second source region is adjacent to the third source region and the fourth source region, and the first source region is not adjacent to any of the second, third and the fourth source regions. The method may further comprise forming a channel region beneath the gate region such that current flows from each of the plurality of source regions to the drain region.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 4:
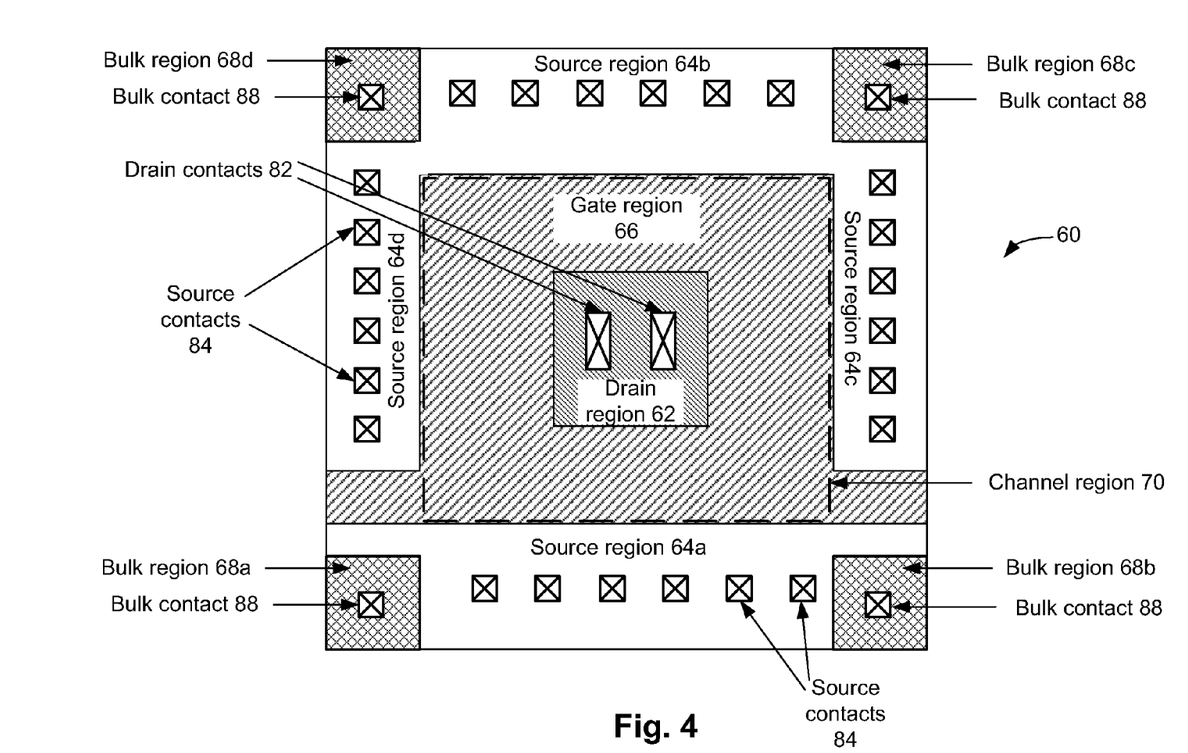
FIG. 4 illustrates a top view of an exemplary MOS cell, in accordance with various embodiments of the present invention.

FIG. 4 illustrates a top view of an exemplary MOS cell 60, in accordance with various embodiments of the present invention. The MOS cell 60 is illustrated to be substantially square, but in various other embodiments, the MOS cell 60 may have a circular shape or any multi-sided polygon shape, such as a rectangle, a hexagon, an octagon, etc. The MOS cell 60 may be, for example, a MOS transistor, including an NMOS or a PMOS transistor. The MOS cell 60 may also be a double-diffused MOS (DMOS), and in various embodiments, the MOS cell 60 may be a square DMOS (SQDMOS).

In various embodiments, the MOS cell 60 may include at least one drain region 62, one gate region 66, a plurality of source regions 64*a*, . . . , 64*d*, and a plurality of bulk regions 68*a*, . . . , 68*d*, formed on a substrate, such as, for example, a silicon substrate, or any other suitable type of substrate.

Referring again to FIG. 4, the drain region 62 is illustrated to be formed in the shape of a square, but other shapes of the drain region (e.g., circular shape or any multi-sided polygon shape, such as, a rectangle, a hexagon, or an octagon) may also be possible. The drain region 62 may include a plurality of drain contacts 82. Although only two rectangular drain contacts are illustrated in FIG. 4, a different number and/or shape of drain contacts may also be possible. In various embodiments, the configuration of the drain region and/or the drain contacts may be based at least in part on one or more operating requirements, including but not limited to, a current and/or a power requirement of the MOS cell 60.

The gate region 66 of the MOS cell 60 may surround or encompass the drain region 62, as illustrated in FIG. 4. The gate region 66 may be formed around drain region 62 in a closed loop having a shape corresponding to that of drain region 62.

In various embodiments, for the purpose of the present invention and unless otherwise stated, a first region and a second region being adjacent would imply that at least a part of the first region lies next to (and possibly in direct contact with) at least a part of the second region, with no interposing region lying between the part of the first region and the part of the second region. Thus, the drain region 62 is adjacent to the gate region 66, as illustrated in FIG. 4.

As illustrated in FIG. 4, a part of the gate region 66 has a square shape, although the gate region 66 may have a circular shape or any multi-sided polygon shape, such as for example, a rectangle, a hexagon, or an octagon, based in part on the shape of drain region 62 and/or the position of the source regions 64*a*, . . . , 64*d*. Gate region 66 may comprise, for example, polysilicon, or any other suitable type of conducting or semi-conducting material. One or more gate contacts (not illustrated in FIG. 4) may also be attached to the gate region 66.

A channel region 70 (illustrated by dotted lines in FIG. 4) may be formed beneath the gate region 66, and may be configured such that current may flow from each of the source regions 64*a*, . . . , 64*d* to the drain region 62. Although for illustrative purposes, the boundary of the channel region 70 is shown to be inside the gate region 66, in various embodiments, the boundary (or at least a part of the boundary) of the channel region 70 and the boundary of the gate region 66 may substantially overlap. In FIG. 4, the channel region 70 is illustrated to be absent in the space between the source regions 64*a* and 64*c* (or between the source regions 64*a* and 64d), although in various embodiments, the channel region 70 may be extended to this space as well.

In various embodiments, each of the source regions 64a, . . . , 64d in the MOS cell 60 may be arranged on a respective side of the gate region 66, across from the drain region 62, such that each side of the drain region 62 is aligned with a corresponding source region. In this manner, current flow from a source region to the drain region 62, through channel region 70, may be maximized.

Similarly, the bulk regions may also be arranged around the gate region, across from the drain region 62. In various embodiments, the bulk regions 68a, . . . , 68d may be arranged in various corners of the MOS cell 60.

Each of the source regions 64a, . . . , 64d may include one or more source contacts 84. Similarly, each of the bulk regions 68a, . . . , 68d may include one or more bulk contacts 88. It will be apparent that the configuration (e.g., number, shape and/or size) of the source and/or bulk contacts in FIG. 4 is purely exemplary in nature, and a different configuration of the contacts may also be possible.

As illustrated in FIG. 4, source region 64a may be adjacent to bulk regions 68a and 68b, source region 64b may be adjacent to bulk regions 68c and 68d, source region 64c may be adjacent to bulk region 68c, and source region 64d may be adjacent to bulk region 68d.

As illustrated in FIG. 4, a part of the source region 64d may lie next to a part of the source region 64b (near the bulk region 68d at a corner of the MOS cell 60). That is, source regions 64d and 64b may be adjacent to each other. Similarly, source regions 64c and 64b may also be adjacent to each other.

In various embodiments, the gate region 66 may extend in the space between the source region 64c and source region 64a, thereby separating the source regions 64c and 64a. Thus, source regions 64a and 64c may not be adjacent to each other. Similarly, source regions 64a and 64d may not be adjacent to each other.

In various embodiments, the source regions may separate the bulk regions from the gate region 66. For example, source regions 64b and 64d may jointly separate the bulk region 68d from the gate region 66. Thus, the bulk region 68d may not be adjacent to the gate region 66. Similarly, the source region 64a may separate the bulk regions 68a and 68b from the gate region 66. Thus, the bulk regions 68a and 68b may not be adjacent to the gate region 66. In various embodiments, none of the bulk regions 68a, . . . , 68d may be adjacent to the gate region 66.

By arranging gate region 66 in FIG. 4 so that it is looped around drain region 62, the channel width may be increased by an increase in the gate region, as compared to the MOS cell of FIG. 1. This gain in the channel width may result in a relatively lower value of Ron in the MOS cell 60 of FIG. 4 as compared to the MOS cell 10 of FIG. 1, without a substantial increase in the area of the MOS cell 60. By reducing the Ron, MOS switching times in the MOS cell 60 may be further increased, and thus higher switching speeds and lower energy use per switching event may be attained.

Also, as each of the source regions 64a, . . . , 64d in FIG. 4 may be adjacent to at least one bulk region, this may ensure a good source-bulk contact that is necessary for effective operation of a MOS cell, including maintaining an effective threshold voltage of a MOS transistor. Also, none of the bulk regions 68a, . . . , 68d in the MOS cell 60 may be in contact with the gate or the channel region, which may be necessary for maintaining a relatively large breakdown voltage of a MOS transistor.

Figure 5:
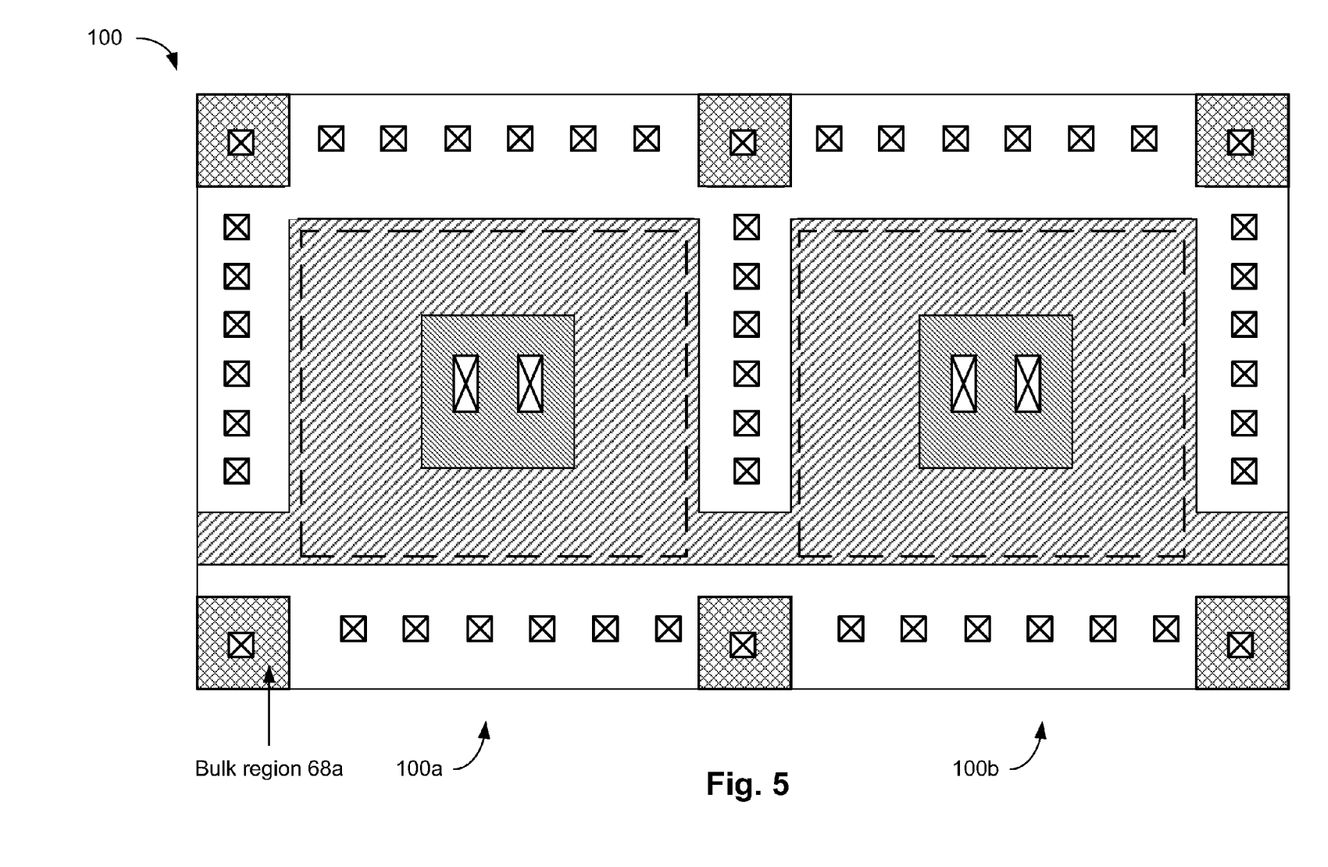
FIG. 5 illustrates a top view of an exemplary array of two MOS cells, in accordance with various embodiments of the present invention.

FIG. 5 illustrates a top view of an exemplary array 100 of two MOS cells, in accordance with various embodiments of the present invention. The array 100 may include MOS cells 100a and 100b, each of which may have a structure substantially similar to that of the MOS cell 60 of FIG. 4. Regions in FIGS. 4 and 5 with similar shadings may represent similar regions. For example, as the checkered regions in FIG. 4 represent bulk regions, the checkered regions in FIG. 5 may also represent bulk regions, as will be apparent to those skilled in the art.

Cells 100a and 100b may be arranged such that at least one of the source regions in each cell overlaps, forming a common source region (in the middle of the array 100). In this manner, the total area of cell array 100 in FIG. 5 may be less than two times the area of an individual cell 60 in FIG. 4, although the channel width of the array 100 in FIG. 5 may be double the channel width of the MOS cell 60. Also, the gate regions of the cells 100a and 100b may be continuous. That is, the gate region of 100a may be adjacent to the gate region of 100b, as illustrated in FIG. 5.

Figure 6A:
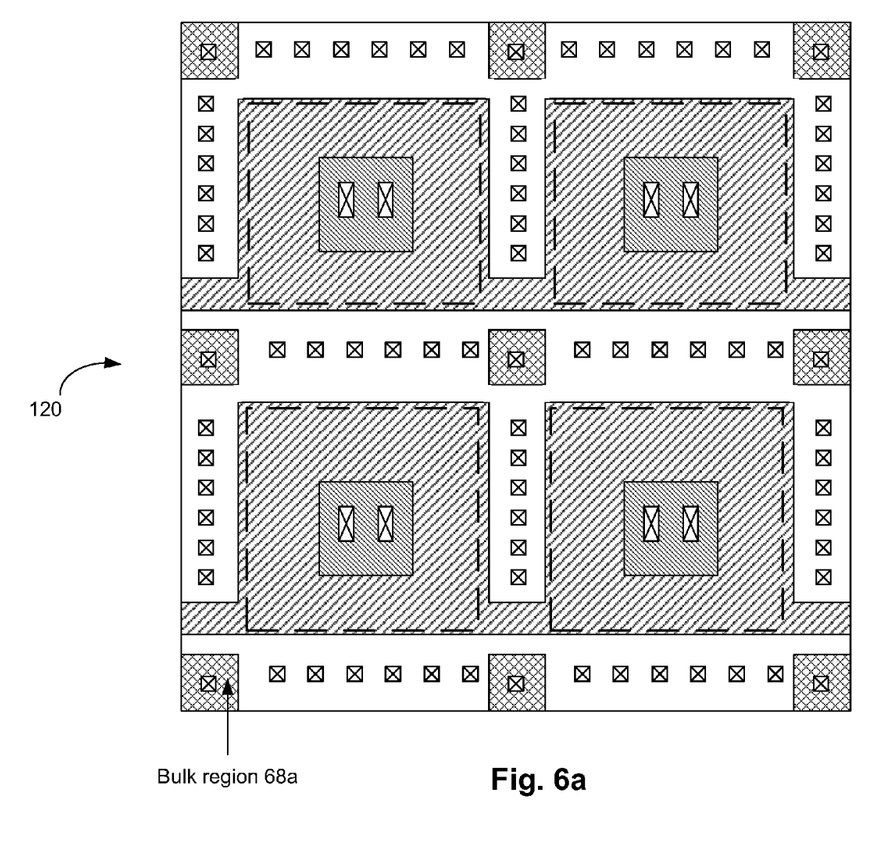
FIGS. 6*a* and 6*b* illustrates top views of two exemplary arrays, each array including four MOS cells, in accordance with various embodiments of the present invention.
Figure 6B:
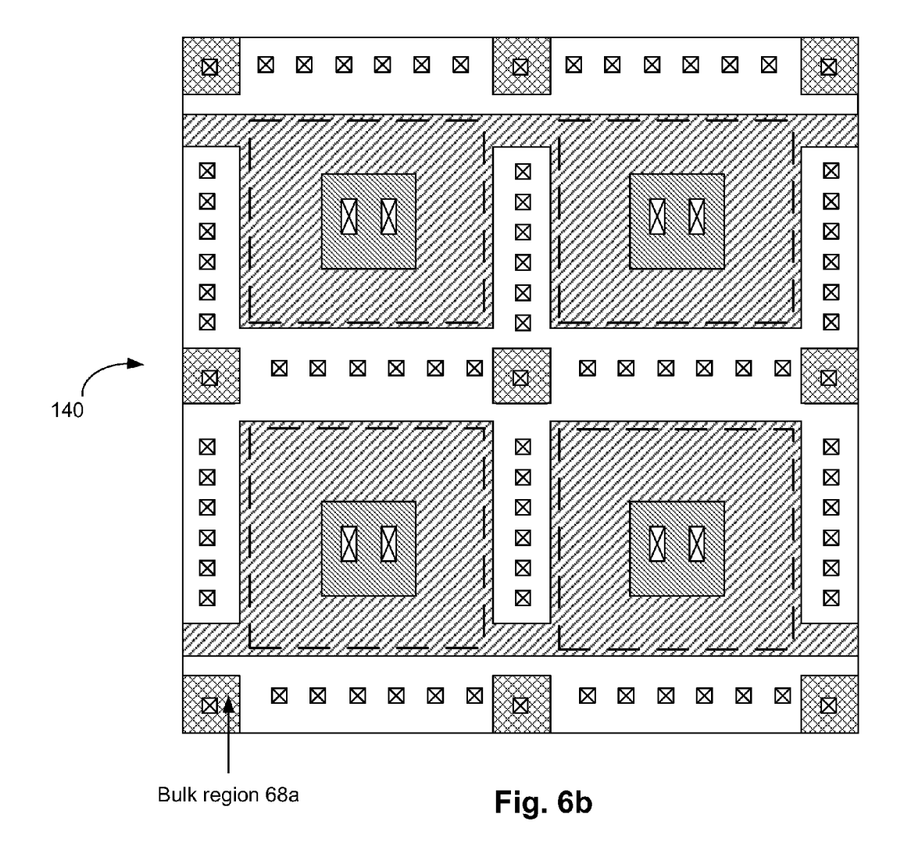

FIGS. 6a and 6b illustrate top views of two exemplary arrays 120 and 140, respectively, each array including four MOS cells, in accordance with various embodiments of the present invention. The structure of individual MOS cells of the array 120 of FIG. 6a is substantially similar to the structure of individual MOS cells of the array 140 of FIG. 6b. However, the way the cells (specifically, the source regions of the cells) are arranged in each array are different in the two figures, as will be apparent to those skilled in the art.

Figure 7:
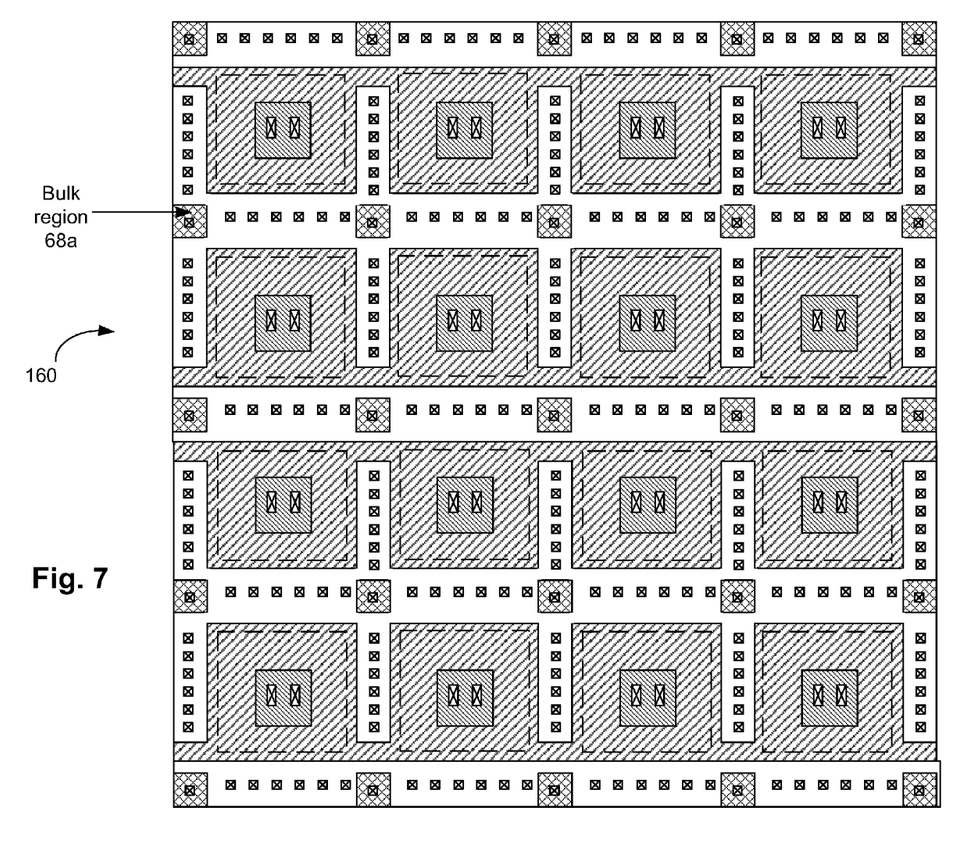
FIG. 7 illustrates a top view of an exemplary array including a plurality of MOS cells, in accordance with various embodiments of the present invention.

FIG. 7 illustrates a top view of an exemplary array 160 including a plurality of MOS cells, in accordance with various embodiments of the present invention. More specifically, the array 160 includes 16 MOS cells, although in various embodiments, there may be any other number of MOS cells in the array 160. The array 160 of FIG. 7 is an extension of the array 140 of FIG. 6b, although it will be apparent to those skilled in the art that the array 120 of FIG. 6a may also be extended to create an array that includes 16 (or any other appropriate) number of MOS cells.

Regions in the MOS cell 60 in FIG. 4 and arrays 120, 140 and 160 in FIGS. 6a, 6b and 7 with similar shadings may represent similar regions. For example, the checkered regions in FIG. 4 represent bulk regions, and the checkered regions in FIGS. 6a, 6b and 7 may also represent bulk regions.

In each of the MOS arrays of FIGS. 6a, 6b and 7, the cells may be arranged such that the gate regions of some of the cells in each of the arrays in FIGS. 6a, 6b and 7 may be continuous. That is, the gate region of a cell in array 120, 140 or 160 may be adjacent to the gate region of a bordering cell.

Additionally, in each of the MOS arrays of FIGS. 6a, 6b and 7, the cells may be arranged such that at least one of the source regions in each cell overlaps with a corresponding source region of a bordering cell. This may result in an increase in the channel width of the arrays 120, 140 and 160 of FIGS. 6a, 6b, and 7, respectively, compared to the channel width of the MOS cell 60 of FIG. 4, without a proportional increase in the area of the array. For example, the channel width of the array 120 may be four times greater than that of the channel width of the MOS cell 60. However, the area of the array 120 may be less than four times the area of the MOS cell 60. This may result in a further decrease in Ron in the arrays 120, 140 and 160 compared to the cell 60, without a proportional increase in the area of each MOS cell in the array.

Although specific embodiments have been illustrated and described herein, it will be appreciated by those of ordinary skill in the art and others, that a wide variety of alternate and/or equivalent implementations may be substituted for the specific embodiment illustrated and described without departing from the scope of the present invention. This present invention covers all methods, apparatus, and articles of manufacture fairly failing within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware. This application is intended to cover any adaptations or variations of the embodiment discussed herein. Therefore, it is manifested and intended that the invention be limited only by the claims and the equivalents thereof.

What is claimed is:

1. A metal oxide semiconductor (MOS) device having a plurality of MOS transistor cells formed in an array, wherein the plurality of MOS transistor cells comprises (i) a first MOS transistor cell and (ii) a second MOS transistor cell, and wherein the first MOS transistor cell comprises:
a drain region;
a gate region surrounding the drain region and formed in a loop around the drain region;
a first plurality of source regions arranged around the gate region, wherein each source region of the first plurality of source regions is situated across from a corresponding side of the drain region, wherein a first source region of the first plurality of source regions is not adjacent to any other source regions of the first plurality of source regions such that the first source region of the first plurality of source regions is separated from the other source regions of the first plurality of source regions by one or more interposing regions, and wherein a second source region of the first plurality of source regions is adjacent to a third source region of the first plurality of source regions such that no interposing region lies between (i) at least a part of the second source region and (ii) at least a part of the third source region,
wherein the second source region forms a common source region for each of (i) the first MOS transistor cell and (ii) the second MOS transistor cell,
wherein the second MOS transistor cell comprises a second plurality of source regions, and
wherein the first source region is adjacent to a fourth source region of the second plurality of source regions of the second MOS transistor cell such that no interposing region lies between (i) at least a part of the first source region and (ii) at least a part of the fourth source region.

2. The MOS device of claim 1, wherein the fourth source region is not adjacent to any other source regions of the second plurality of source regions such that the fourth source region of the second plurality of source regions is separated from the other source regions of the second plurality of source regions by one or more interposing regions.

3. The MOS device of claim 1, wherein the first MOS transistor cell further comprises:
a plurality of bulk regions arranged around the gate region, wherein one or more of the plurality of source regions separate one or more of the plurality of bulk regions from the gate region.

4. The MOS device of claim 3, wherein each of the plurality of bulk regions is fully surrounded by two or more source regions of the first and second plurality of source regions.

5. The MOS device of claim 3, wherein none of the plurality of bulk regions is adjacent to the gate region.

6. The MOS device of claim 3, wherein:
the first source region is adjacent to a first bulk region and a second bulk region;
the second source region is adjacent to a third bulk region;
the third source region is adjacent to the third bulk region and a fourth bulk region; and
a fifth source region of the first plurality of source regions is adjacent to the fourth bulk region.

7. The MOS device of claim 6, wherein the third source region is adjacent to the fifth source region.

8. The MOS device of claim 1, wherein the drain region has a multi-sided polygon shape including one of a square, a rectangle, a hexagon and an octagon.

9. The MOS device of claim 1, wherein the drain region has a multi-sided polygon shape including one of a square and a rectangle.

10. The MOS device of claim 1, wherein the plurality of bulk regions are arranged in one or more corners of the device.

11. The MOS device of claim 1, wherein a channel region is formed beneath the gate region.

12. The MOS device of claim 11, wherein the channel region is configured so that current flows from each source region to the drain region.

13. The MOS device of claim 1, wherein the MOS device is formed on a substrate.

14. The device of claim 1, wherein the MOS device is a square double-diffused MOS (SQDMOS).

15. The MOS device of claim 1, wherein the gate region is formed in a closed loop around the drain region.

16. A method for forming a metal oxide semiconductor (MOS) device, wherein the MOS device comprises a plurality of MOS transistor cells formed in an array, wherein the plurality of MOS transistor cells comprises (i) a first MOS transistor cell and (ii) a second MOS transistor cell, and wherein the method comprises:
forming a drain region of the first MOS transistor cell;
forming a gate region of the first MOS transistor cell, wherein the gate region surrounds the drain region and is formed in a loop around the drain region;
forming a first plurality of source regions of the first MOS transistor cell, wherein the first plurality of source regions is arranged around the gate region, wherein each source region of the first plurality of source regions is situated across from a corresponding side of the drain region, wherein a first source region of the first plurality of source regions is not adjacent to any other source regions of the first plurality of source regions such that the first source region of the first plurality of source regions is separated from the other source regions of the first plurality of source regions by one or more interposing regions, and wherein a second source region of the first plurality of source regions is adjacent to a third source region of the first plurality of source regions such that no interposing region lies between (i) at least a part of the second source region and (ii) at least a part of the third source region,
wherein the second source region forms a common source region for each of (i) the first MOS transistor cell and (ii) the second MOS transistor cell,
wherein the second MOS transistor cell comprises a second plurality of source regions, and
wherein the first source region is adjacent to a fourth source region of the second plurality of source regions of the second MOS transistor cell such that no interposing region lies between (i) at least a part of the first source region and (ii) at least a part of the fourth source region.

17. The method of claim 16, wherein the fourth source region is not adjacent to any other source regions of the second plurality of source regions such that the fourth source region of the second plurality of source regions is separated from the other source regions of the second plurality of source regions by one or more interposing regions.

18. The method of claim 16, wherein the method further comprises:
- forming a plurality of bulk regions of the first MOS transistor cell, wherein the plurality of bulk regions is arranged around the gate region, wherein one or more of the plurality of source regions separate one or more of the plurality of bulk regions from the gate region.

19. The method of claim 18, wherein each of the plurality of bulk regions is fully surrounded by two or more source regions of the first and second plurality of source regions.

20. The method of claim 18, wherein:
- the first source region is adjacent to a first bulk region and a second bulk region;
- the second source region is adjacent to a third bulk region;
- the third source region is adjacent to the third bulk region and a fourth bulk region; and
- a fifth source region of the first plurality of source regions is adjacent to the fourth bulk region.

* * * * *